United States Patent
Tsuyuki et al.

(10) Patent No.: US 6,738,251 B2
(45) Date of Patent: May 18, 2004

(54) CONDUCTIVE PATTERN INCORPORATED IN A MULTILAYERED SUBSTRATE, MULTILAYERED SUBSTRATE INCORPORATING A CONDUCTIVE PATTERN, AND A METHOD OF FABRICATING A MULTILAYERED SUBSTRATE

(75) Inventors: Hiroshi Tsuyuki, Tokyo (JP); Osamu Hirose, Tokyo (JP)

(73) Assignee: TDK Corporation, Tokyo (JP)

( * ) Notice: Subject to any disclaimer, the term of this patent is extended or adjusted under 35 U.S.C. 154(b) by 124 days.

(21) Appl. No.: 09/937,962

(22) PCT Filed: Jan. 22, 2001

(86) PCT No.: PCT/JP01/00380

§ 371 (c)(1),
(2), (4) Date: Sep. 28, 2001

(87) PCT Pub. No.: WO01/56047

PCT Pub. Date: Aug. 2, 2001

(65) Prior Publication Data

US 2002/0187317 A1 Dec. 12, 2002

(30) Foreign Application Priority Data

Jan. 28, 2000 (JP) .................................... 2000-0200003

(51) Int. Cl.[7] .............................................. H01G 4/06
(52) U.S. Cl. ................. 361/321.1; 361/320; 361/306.1; 361/306.3; 361/313; 252/62.3
(58) Field of Search ................... 361/321.2, 306.1, 361/306.3, 313, 311, 321.4, 303, 321, 320; 428/209, 210; 252/62.3; 257/59, 60, 758

(56) References Cited

U.S. PATENT DOCUMENTS

| | | | |
|---|---|---|---|
| 4,508,792 A | * | 4/1985 | Ishiwata |
| 4,636,908 A | * | 1/1987 | Yoshihara et al. |
| 4,650,923 A | * | 3/1987 | Nishigaki et al. |
| 5,334,860 A | * | 8/1994 | Naito |
| 5,786,986 A | * | 7/1998 | Bregman et al. |
| 6,139,777 A | * | 10/2000 | Omoya et al. |
| 6,475,607 B2 | * | 11/2002 | Ueda et al. |

FOREIGN PATENT DOCUMENTS

| | | |
|---|---|---|
| JP | 05041110 A | 2/1993 |
| JP | 05047209 A | 2/1993 |
| JP | 06020516 A | 1/1994 |
| JP | 11021644 A | 1/1999 |

\* cited by examiner

*Primary Examiner*—Anthony Dinkins
*Assistant Examiner*—Nguyen T. Ha
(74) *Attorney, Agent, or Firm*—Brown Raysman Millstein Felder & Steiner LLP

(57) ABSTRACT

The present invention provides a conductive pattern that has low electric resistivity, is superior in adhesion to a substrate and does not cause substrate cracking during plating, a multilayered substrate incorporating such a conductive pattern, and a fabricating method for a multilayered substrate. At first, a conductive composition including a metal powder containing not less than 95 mass % of Ag, a sintering restrainer containing Cr and/or Cr compound, a dielectric loss conditioner containing Mn and/or Mn compound, and a vehicle is prepared. Next, electrodes made of the conductive composition are formed on a plurality of green sheets. The plurality of green sheets formed with the electrodes are then laminated to form a laminated product, whereafter the laminated product is sintered.

16 Claims, 1 Drawing Sheet

CONDUCTIVE PATTERN INCORPORATED IN A MULTILAYERED SUBSTRATE, MULTILAYERED SUBSTRATE INCORPORATING A CONDUCTIVE PATTERN, AND A METHOD OF FABRICATING A MULTILAYERED SUBSTRATE

RELATED APPLICATIONS

This application claims the priority of PCT/JP01/00380, filed Jan. 22, 2001, which designated the United States of America; PCT/JP01/00380 was published in the Japanese language as WO 01/56047, Aug. 2, 2001.

BACKGROUND OF THE INVENTION

The present invention relates to a conductive pattern incorporated in a multilayered substrate such as a multilayered LC component, which conductive pattern has low electric resistivity, is superior in adhesion to the substrate, does not cause substrate cracking during plating and does not increase dielectric loss, a multilayered substrate incorporating such a conductive pattern, and a method of fabricating a multilayered substrate.

DESCRIPTION OF THE PRIOR ART

In recent years, the miniaturization of electronic devices has made it necessary to miniaturize the electrical components incorporated in these devices. In the particular case of components that utilize ceramics and circuit substrates, such as inductors, capacitors and filters, miniaturization is achieved by laminating them into a multilayered structure. Such a multilayered component is fabricated by printing a conductive paste on green sheets fabricated by a sheet method, printing method or the like to apply a mixture of ceramic powder and organic binder, thereafter laminating, crimping, cutting and sintering the sheets, and then forming external electrodes on the laminated body. In general, the conductive paste is composed of metal powder dispersed in an organic binder and an organic solvent.

Ag (silver), which has low resistivity, is used as the conductive material to obtain a low-resistivity conductive paste for use in LC components requiring a high quality factor (Q value), filter components, and circuit substrates. The sintering temperature of the ceramic material, which is a material of the substrate sintered together with the conductive material, must be lower than the melting point of Ag (960.5° C.). A glass-ceramic, i.e., a ceramic containing a glass material that works as a sintering assistant, is commonly used as the ceramic material.

However, the contraction starting temperature of Ag is as low as 300° C.–500° C., while the contraction starting temperature of a glass-ceramic is 700° C.–940° C. Therefore, when Ag is used as the conductive material of the conductive paste, stress arises between the conductive layer and the ceramic layer because the contractions are not of the same degree. As a result, defects such as cracks, delaminations, and the like may be induced. Thus, the sintering characteristics of the Ag powder and the ceramic material included in the conductive paste should be identical. Specifically, the degrees of contraction of the ceramic material and the conductive material should be identical at every temperature during sintering. Thus, some method is needed for restraining the progress of the Ag sintering. One known method for restraining the progress of the Ag sintering is to add glass powder made of the $SiO_2$—$Al_2O_3$ family or the like to the conductive paste. According to this method, cracking is prevented because the progress of the Ag sintering is restrained by the glass powder. Japanese Patent Laid Open No. 6-20516, for example, teaches another method in which Cr or Cr compound, serving as sintering controller, and $Al_2O_3$, PdO or any of various other ceramics, serving as inorganic binder, are added to the conductive composition in order to prevent the substrate from experiencing appearance defects such as warping and cracks, and to enhance the adhesive strength to the substrate.

However, in order to thoroughly avoid warping or cracks, it is necessary to add a large amount of glass. When such a conductive composition is used for the internal conductors incorporated in a multilayered substrate having capacitors (capacitor integrated), various problems arise, including increased conductor resistance and increased dielectric loss. Moreover, experiments conducted by the inventors revealed that use of a conductive composition with Cr or Cr compound added for the electrodes of the capacitors increases dielectric loss.

The objects of the present invention are therefore to provide a conductive pattern incorporated in a multilayered substrate such as a multilayered LC component, which conductive pattern has low electric resistivity, is superior in adhesion to a substrate, does not cause substrate cracking during plating and does not increase dielectric loss, to provide a multilayered substrate incorporating such a conductive pattern, and to provide a method of fabricating a multilayered substrate.

SUMMARY OF THE INVENTION

Through extensive research for realizing a multilayered ceramic component that does not crack or warp and experiences no degradation of electrical characteristics, the inventors of the present invention found that addition of Cr to the conductive composition increases dielectric loss because the Cr diffuses into the substrate and reacts with the glass component of the substrate so that a glass having high dielectric loss is formed. Their research further led to the discovery that adding Mn to the conductive composition effectively prevents Cr from diffusing in excess.

Based on these technical concepts, the above objects of the present invention can be accomplished as set out in the following:

The above and other objects of the present invention can be accomplished by a conductive pattern incorporated in a multilayered substrate characterized in that the conductive pattern includes Ag as a main component, Cr and/or Cr compound, and Mn and/or Mn compound.

According to this aspect of the present invention, the conductive pattern has low electric resistivity, is superior in adhesion to a substrate and does not cause substrate cracking during plating because Cr and/or Cr compound are added to Ag as a main component of the conductive pattern, while increase of dielectric loss is prevented because Mn and/or Mn compound is added.

In a preferred aspect of the present invention, Cr and/or Cr compound content calculated based on $Cr_2O_3$ is 0.1–2.0 mass % relative to Ag.

In a further preferred aspect of the present invention, Mn and/or Mn compound content calculated based on $MnO_2$ is 0.1–5.0 mass % relative to Ag.

In a further preferred aspect of the present invention, the conductive pattern further includes Al and/or Al compound.

In a further preferred aspect of the present invention, Al and/or Al compound content calculated based on $Al_2O_3$ is 0.1–1.0 mass % relative to Ag.

In a further preferred aspect of the present invention, the conductive pattern is a capacitor electrode.

The above and other objects of the present invention can be also accomplished by a multilayered substrate having a plurality of substrates and conductive patterns incorporated in the plurality of substrates characterized in that the conductive patterns include Ag as a main component, Cr and/or Cr compound, and Mn and/or Mn compound.

According to this aspect of the present invention, the conductive pattern has low electric resistivity, is superior in adhesion to the substrate and does not cause substrate cracking during plating because Cr and/or Cr compound are added to Ag as a main component of the conductive pattern, while increase of dielectric loss is prevented because Mn and/or Mn compound are added.

In a preferred aspect of the present invention, the substrates are made of a glass-ceramic material composed of a glass component and a ceramic component.

In a further preferred aspect of the present invention, the volume ratio between the glass component and ceramic component contents is 50:50 to 80:20.

In a further preferred aspect of the present invention, the glass component includes $SiO_2$—RO—$Al_2O_3$—$B_2O_3$ (where R is alkaline earth metal).

In a further preferred aspect of the present invention, the ceramic component includes one or more components selected from the group consisting of $Al_2O_3$, $TiO_2$, and $TiO_2$ compound.

In a further preferred aspect of the present invention, the conductive pattern further includes Al and/or Al compound.

In a further preferred aspect of the present invention, the conductive patterns are capacitor electrodes.

The above and other objects of the present invention can be also accomplished by a method of fabricating a multilayered substrate comprising a step of preparing a conductive composition including metal powder containing Ag at not less than 95 mass %, a sintering restrainer containing Cr and/or Cr compound, a dielectric loss conditioner containing Mn and/or Mn compound, and a vehicle, a step of forming electrodes made of the conductive composition on a plurality of green sheets, a step of laminating the plurality of green sheets on which the electrodes are formed to form a laminated product, and a step of sintering the laminated product.

According to this aspect of the present invention, the conductive pattern has low electric resistivity, is superior in adhesion to the substrate, and does not cause substrate cracking during plating because Cr and/or Cr compound are added to Ag as a main component of the conductive pattern, while increase of dielectric loss is prevented because Mn and/or Mn compound are added.

In a preferred aspect of the present invention, Cr and/or Cr compound content calculated based on $Cr_2O_3$ is 0.1–2.0 mass % relative to the metal powder.

In a further preferred aspect of the present invention, Mn and/or Mn compound content calculated based on $MnO_2$ is 0.1–5.0 mass % relative to the metal powder.

In a further preferred aspect of the present invention, the conductive composition further includes Al and/or Al compound.

In a further preferred aspect of the present invention, Al and/or Al compound calculated based on $Al_2O_3$ is 0.1–1.0 mass % relative to the metal powder.

In a further preferred aspect of the present invention, the metal powder has an average grain size of 0.1 μm–10 μm.

In a further preferred aspect of the present invention, the sintering step is performed at a temperature of 750° C.–940° C.

Although Japanese Patent Laid Open No.5-41110 teaches a technique of adding a glass flit, $Cr_2O_3$, and $MnO_2$ to a conductive paste including Ag powder and Pt powder, the technique is directed to a conductive paste used for a wiring pattern formed on the surface of a sintered multilayered substrate, not to a conductive paste incorporated in a multilayered substrate and sintered together with the substrate.

DESCRIPTION OF THE PREFERRED EMBODIMENT

Figure 1:
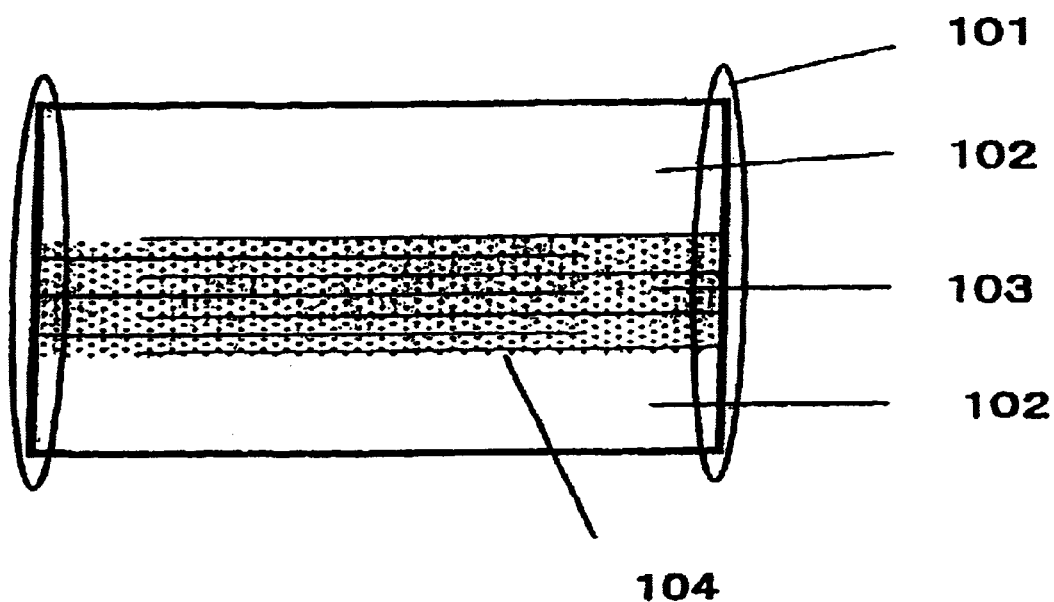
FIG. 1 is a cross sectional view showing a multilayered substrate that is a preferred embodiment of the present invention.

A conductive composition, i.e., a conductive paste, used in a preferred embodiment of the present invention is composed of at least metal powder as a main component, a sintering restrainer controlling the sintering characteristics, a dielectric loss conditioner preventing the sintering restrainer from diffusing, and a vehicle.

Although the metal powder is not limited to a specific material insofar as it has a low resistivity capable of ensuring a high Q value, it is preferable to select Ag powder, the metal powder having the lowest resistivity, from a practical standpoint. It is also possible to select an Ag alloy powder such as Ag—Cu, Ag—Pd, Ag—Pt or the like insofar as Ag is the main component. In this case, it is preferable that the Ag content be not less than 95 mass %. The average grain size of the metal powder is preferably selected at 0.1 μm–10 μm taking into account the sintering characteristics, the paste characteristics, and the like.

As the sintering restrainer added to the metal powder, Cr and/or Cr compound and Al and/or Al compound are used. Their addition enhances adhesive strength to the substrate and prevents occurrence of delaminations and cracks during sintering and plating. As Cr compound, $Cr_2O_3$, $CrF_3$, and the like can be used. As Al compound, $Al_2O_3$ can be used. Cr and Al can be added as organometallic compounds. Further, it is permissible to use only at least one of Cr and Cr compound as the sintering restrainer without using Al and/or Al compound. However, a sintering restrainer using both Cr and/or Cr compound and Al and/or Al compound exhibits a more effective sintering restrainer function.

The amount of the sintering restrainer is preferably 0.1–2.0 mass % relative to the metal powder for Cr and/or Cr compound calculated based on $Cr_2O_3$ and 0.1–1.0 mass % relative to the metal powder for Al and/or Al compound calculated based on $Al_2O_3$. If the amount of $Cr_2O_3$ and $Al_2O_3$ fall below these ranges, delaminations or cracks readily occur. If the amount thereof exceeds these ranges, the dielectric loss or resistivity increases.

As the dielectric loss conditioner added into the metal powder, Mn and/or Mn compound are used. Their addition prevents Cr from diffusing excessively, thereby enabling fabrication of a laminated ceramic component that resists cracking and warping and does not experience degradation of electrical characteristics even if sintered together with the substrate. As Mn compound, $MnO_2$ and the like can be used. Mn can be added as organometallic compound. The amount of dielectric loss conditioner is preferably 0.1–5.0 mass % relative to the metal powder calculated based on $MnO_2$. If the amount of $MnO_2$ falls below this range, the foregoing effects cannot be sufficiently obtained. If the amount of $MnO_2$ exceeds this range, the resistivity increases.

Although the optimum average grain sizes of the sintering restrainer and the dielectric loss conditioner depend on the average grain size of the metal powder, their average grain sizes are preferably smaller than that of metal powder so that they disperse uniformly.

The conductive paste is suitable to use not only for the electrodes of capacitors incorporated in the multilayered substrate having capacitors, but also for internal conductors and via hole metal.

The conductive composition (conductive paste) is prepared by adding the sintering restrainer and the dielectric loss conditioner to the metal powder and then dispersing the resulting mixture into the organic vehicle. Addition of the sintering restrainer and the dielectric loss conditioner can be performed after dispersing them into the vehicle. Specifically, the conductive paste is prepared by adding the organic vehicle into the metal powder, the sintering restrainer, and the dielectric loss conditioner, followed by thorough mixing with a three-roll mill, for example. The organic vehicle includes an organic binder and an organic solvent. As the organic binder, various known organic binders can be used such as ethyl cellulose, acrylic resin, and butyral resin. The amount of the organic binder is preferably around 1–10 mass %. As the organic solvent, various known organic solvents can be used such as butyl carbitol, terpineol, and kerosine. The amount of the organic solvent is preferably around 22–55 mass %. Moreover, a dispersing agent such as sorbitan fatty acid ester or glycerine fatty acid ester and a plasticizer such as dioctyl phthalate, dibutyl phthalate, or butyl phthalic glycolic acid butyl can be added according to need in the range of less than around 10 mass % in total.

The conductive composition having the foregoing composition is printed on green sheets, which are explained later. After the green sheets printed with the conductive composition have been laminated, crimped and cut, the conductive composition and the green sheets are sintered simultaneously. In this embodiment, the green sheets are made of glass-ceramic material.

The glass-ceramic material includes glass powder (glass component) and powder of an oxide aggregate (ceramic component). Although the types and contents of the glass powder and the oxide aggregate are not limited insofar as the mixture thereof can be sintered at a temperature lower than the melting point of Ag, the volume ratio between the contents of the glass powder and the oxide aggregate is preferably in the range of 50:50 to 80:20.

More preferably, the glass powder is composed of $SiO_2$ as a main component and, as sub-components, at least one alkaline earth metal such as SrO, BaO and CaO, $Al_2O_3$ and $B_2O_3$. The content of the sub-components is preferably 10–40 mol % and particularly preferably 15–40 mol %. When the sub-component content is deficient, formation of feldspars becomes insufficient so that popping tends to occur. When the sub-component content is excessive, glass does not readily form and the strength of the glass-ceramic material becomes low. The $Al_2O_3$ content is preferably 5–10 mol %. When $Al_2O_3$ is content is deficient, formation of feldspars becomes insufficient so that popping tends to occur. When $Al_2O_3$ content is excessive, glass does not readily form and sintering at a temperature lower than the melting point of Ag becomes difficult because the softening point of the glass increases. The content of $B_2O_3$ is preferably 1–10 mol %. When $B_2O_3$ content is deficient, the softening point of the glass increases and the resulting incomplete sintering of glass-ceramic material becomes a cause of low strength. When $B_2O_3$ content is excessive, the softening point of the glass decreases to cause insufficient degreasing and Ag diffusion.

As the oxide aggregate, one or more oxide aggregates can be selected from various known oxide aggregates such as $Al_2O_3$, $TiO_2$, $TiO_2$ compound (perovskite compounds such as $BaTiO_3$, $SrTiO_3$, and $CaTiO_3$, $BaO$-$4TiO_2$, and $BaO$—$Nd_2O_3$—$TiO_2$, for example), cordierite, and mullite. When $Al_2O_3$ is used as the oxide aggregate, its content in the glass can be decreased but should nevertheless preferably be not less than 5 mol %.

The multilayered substrate according to this embodiment can be fabricated by the following method:

First, the glass-ceramic powder, composed of the glass powder and the oxide aggregate, and the organic vehicle or the like, are mixed with, for example, a ball mill pot made of earthenware. Any commonly used mixing can be used, insofar as is the components can be fully mixed and uniformly dispersed. The organic vehicle or the like is not limited to a specific material but can be selected from among various commonly used materials.

For example, as the binder included in the organic vehicle, one or more materials selected from among polyvinyl butyral (PVB), ethyl cellulose, acrylic resin, and the like can be used, ordinarily at 7–20 parts by mass per 100 parts by mass of the glass-ceramic powder.

As the solvent included in the organic vehicle, one or more materials selected from among methanol, ethanol, propanol, butanol and other alcohols, toluene, xylene, methyl ethyl ketone, acetone and the like can be used, ordinarily at 40–60 parts by mass per 100 parts by mass of the glass-ceramic powder.

As the plasticizer included in the organic vehicle, one or more materials selected from among diethyl phthalate (DEP), dibutyl phthalate (DBP), dioctyl phthalate (DOP), dibutyl phthalate, n-butyl phthalyl n-butyl glycolate (BPBG) and the like can be used, ordinarily at 3–7 parts by mass per 100 parts by mass of the glass-ceramic powder. The additives to be incorporated in the organic vehicle for fabricating substrate are not particularly limited and other additives than the foregoing can be used as required.

Green sheets of a predetermined thickness appropriate for the intended use are formed from a slurry of the glass-ceramic powder uniformly mixed with the organic vehicle or the like using a ball mill or the like.

After the conductive composition (conductive paste) has been applied to the plurality of green sheets to form the electrodes, the green sheets are laminated and cut to predetermined size.

The methods of forming the green sheets, forming the circuits, and laminating the green sheets are not particularly limited and any of various ordinary methods can be used. For example, it is possible to form the green sheets by a doctor blade method or the like, to form the electrodes by a screen printing method or the like, and then laminate the green sheets by crimping.

Next, a multilayered substrate incorporating the conductive patterns is formed by sintering the laminated product at a temperature in the approximate range of 750° C.–940° C., ordinarily for around 15 minutes to 5 hours. When the sintering temperature is higher than this range, the conductive composition diffuses, which is undesirable. When the sintering temperature is lower than said range, the sintered density becomes low, which is also undesirable. External electrodes are formed on the multilayered substrate and plating is conducted as required.

EXAMPLE

Two types of glass-ceramic materials of different composition were prepared.

The first type (glass-ceramic A) consisted of glass composed of $SiO_2$: 62 mol %, $Al_2O_3$: 8 mol %, SrO: 20 mol %, CaO: 4 mol %, $B_2O_3$: 3 mol % and MgO: 3 mol %, and oxide aggregate composed of $Al_2O_3$. The ratio of the oxide aggregate to the glass was 30:70 by volume. An organic vehicle including 15 parts by mass of acrylic resin as the binder, 50 parts by mass of toluene as the solvent, and 5 parts by mass of BPBG was added to and mixed with 100 parts by mass of the powder of the foregoing composition, and the result was processed into green sheets of 240 μm thickness using the doctor blade method.

The second type (glass-ceramic B) consisted of glass whose composition was the same as the glass-ceramic A, and an oxide aggregate composed of $Al_2O_3$ and $TiO_2$ mixed at a ratio of 1:1 by volume. The ratio of the oxide aggregate to the glass was 30:70 by volume. The glass-ceramic B was processed into green sheets of 30 μm thickness by the same method as described above.

The conductive paste was prepared by adding $Cr_2O_3$, $Al_2O_3$ and $MnO_2$ in the amounts shown in TABLE 1 to 100 mol % of Ag (average grain size: 1.0 μm) as the main component, adding the vehicle to the mixture, and mixing the result to a pasty consistency with a three-roll mill. The vehicle used contained ethyl cellulose resin as the binder and terpineol and butyl carbitol acetate as the solvent. An organometallic compound marketed as an aluminum coupling agent (Plen Act ALM, product of Ajinomoto Co., Ltd.) was used as the $Al_2O_3$.

TABLE 1

| SAMPLE No. | AMOUNT OF ADDITIVES (MASS %) | | |
| --- | --- | --- | --- |
| | $Al_2O_3$ | $Cr_2O_3$ | $MnO_2$ |
| 1* | 0.0 | 0.5 | 0.0 |
| 2* | 0.2 | 0.0 | 0.0 |
| 3* | 0.2 | 0.1 | 0.0 |
| 4* | 0.2 | 0.3 | 0.0 |
| 5* | 0.2 | 0.5 | 0.0 |
| 6* | 0.2 | 0.8 | 0.0 |
| 7* | 0.2 | 1.0 | 0.0 |
| 8 | 0.2 | 0.3 | 0.3 |
| 9 | 0.2 | 1.0 | 1.0 |
| 10 | 0.2 | 2.0 | 2.0 |
| 11* | 0.2 | 3.0 | 3.0 |
| 12 | 0.2 | 0.5 | 0.2 |
| 13 | 0.2 | 0.5 | 0.5 |
| 14 | 0.2 | 0.5 | 1.0 |
| 15 | 0.2 | 0.5 | 2.0 |
| 16 | 0.2 | 0.5 | 5.0 |
| 17* | 0.2 | 0.5 | 7.0 |
| 18 | 0.5 | 0.5 | 0.5 |
| 19 | 1.0 | 0.5 | 0.5 |
| 20* | 2.0 | 0.5 | 0.5 |

*COMPARATIVE EXAMPLE

Next, the conductive pastes were screen-printed on the green sheets made of glass-ceramic B to a thickness of approximately 10 μm. The printed conductive paste formed 2×3 mm rectangular capacitor patterns with lead wires. Seven printed green sheets were laminated, two green sheets made of glass-ceramic A were laminated on each of the top and the bottom of the laminated product, the result was heat pressed, cut to 4.5×3.2 mm chip size and sintered at 900° C. for 10 minutes to obtain a multilayered substrate. External conductive paste made of Ag-glass (H2980, product of Shoei Kagaku Co., Ltd.) was coated on the side surface of the sample multilayered substrate, followed by sintering at 850° C. for 10 minutes and barrel plating with Cu, Ni and Sn. Test samples were thus obtained for each of sample numbers 1–20 shown in TABLE 2.

FIG. 1 is a schematic cross-sectional view showing a multilayered substrate fabricated by the above-described method. Reference numeral 101 in this figure designates external electrodes, 102 designates glass-ceramic A, 103 designates glass-ceramic B, and 104 designates glass-patterns.

Whether or not the laminated product experienced internal defects was judged based on presence/absence of cracks and delamination after sintering.

Insulation resistance was measured at 50 V DC using a YHP (Yokogawa Hewlett Packard) 432 and dielectric loss was measured at 1 Vrms and 1 MHz using a YHP4285A.

The evaluation result for each test sample is shown in TABLE 2. The effect of the present invention is apparent from the evaluation results.

TABLE 2

| SAMPLE No. | RATIO OF INSULATION DEFECT (%) | DIELECTRIC LOSS (%) | RESISTIVITY (μΩ · cm) | WARPING OR DELAMINATION |
| --- | --- | --- | --- | --- |
| 1* | 12.8 | 0.1376 | 1.91 | DELAMINATION |
| 2* | 33.3 | 0.0668 | 1.93 | NO |
| 3* | 16.7 | 0.0817 | 2.05 | NO |
| 4* | 2.7 | 0.1424 | 2.46 | NO |
| 5* | 0.0 | 0.1680 | 2.36 | NO |
| 6* | 0.0 | 0.1932 | 2.44 | NO |
| 7* | 0.0 | 0.2394 | 2.51 | NO |
| 8 | 0.0 | 0.0854 | 2.17 | NO |
| 9 | 0.0 | 0.1210 | 2.25 | NO |
| 10 | 0.0 | 0.1395 | 2.56 | NO |
| 11* | 0.0 | 0.1833 | 3.09 | NO |
| 12 | 0.0 | 0.1199 | 2.33 | NO |
| 13 | 0.0 | 0.0963 | 2.23 | NO |
| 14 | 0.0 | 0.0767 | 1.98 | NO |
| 15 | 0.0 | 0.0854 | 2.13 | NO |
| 16 | 0.0 | 0.1273 | 2.91 | NO |
| 17* | 0.0 | 0.2000 | 3.06 | NO |
| 18 | 0.0 | 0.1050 | 2.55 | NO |
| 19 | 0.0 | 0.1376 | 2.82 | NO |
| 20* | 0.0 | 0.1603 | 3.31 | WARPING |

*COMPARATIVE EXAMPLE

As apparent from TABLE 2, delaminations and/or insulation defects caused by cracking occurred in sample No.1, which was not added with either $Al_2O_3$ or $MnO_2$, and in samples No.2–4, which were not added with $MnO_2$ and had $Cr_2O_3$ contents of 0.3 mass % or less. Samples No.5–7, which were not added with $MnO_2$, and had $Al_2O_3$ contents of not less than 0.2 mass %, and $Cr_2O_3$ contents of not less than 0.5 mass % did not experience delaminations and/or insulation defects but exhibited high dielectric losses, higher than 0.23% in sample No.7.

In contrast, samples No.8–10, 12–16, 18, and 19 according to the present invention, which were added with $MnO_2$, experienced no delaminations and/or insulation defects and had dielectric losses as low as 0.14% or less. Sample No.14 is particularly noteworthy since it experienced no delamination and/or insulation defect and incurred very little degradation of dielectric property. However, samples No.11 and 17, which were added with excess amounts of $Cr_2O_3$ and/or $MnO_2$, were not suitable because their dielectric losses were 0.18% or greater and their resistivities were 3.0 $\mu\Omega\cdot cm$ or greater.

Further, sample No.20, which was added with more than 1.0% $Al_2O_3$, was not suitable because of substrate warping and increased resistivity.

As is apparent from the foregoing, the present invention, by adding $Al_2O_3$, $Cr_2O_3$, and $MnO_2$ to Ag as a main component, provides a conductive pattern that has low electric resistivity, is superior in adhesion to a substrate, does not cause substrate cracking during plating and does not increase dielectric loss, and further provides a multilayered substrate incorporating such a conductive pattern, and a method of fabricating a multilayered substrate.

Industrial Applicability

As explained in the foregoing, the conductive pattern of the present invention can be used as the conductive pattern incorporated in a multilayered substrate such as a multilayered LC component. Further, the multilayered substrate of the present invention and the multilayered substrate fabricated by the method of the present invention can be used as multilayered LC components.

What is claimed is:

1. A conductive pattern incorporated in a multilayered substrate made of glass-ceramic and to be baked together with the multilayered substrate, the conductive pattern including Ag as a main component, Cr and/or Cr compound, and Mn and/or Mn compound, and Al and/or Al compound.

2. The conductive pattern as claimed in claim 1, wherein Cr and/or Cr compound content calculated based on $Cr_2O_3$ is 0.1–2.0 mass % relative to Ag.

3. The conductive pattern as claimed in claim 1, wherein Mn and/or Mn compound content calculated based on $MnO_2$ is 0.1–5.0 mass % relative to Ag.

4. The conductive pattern as claimed in claim 1, wherein the Al and/or Al compound content calculated based on $Al_2O_3$ is 0.1–1.0 mass % relative to Ag.

5. The conductive pattern as claimed in claim 1, wherein the conductive pattern is a capacitor electrode.

6. A multilayered substrate having a multilayered unit including a plurality of substrates made of glass-ceramic and conductive patterns incorporated in the multilayered unit and baked together with the multilayered unit, the conductive pattern including Ag as a main component, Cr and/or Cr compound, and Mn and/or Mn compound, and Al and/or Al compound.

7. The multilayered substrate as claimed claim 6, wherein each of the substrates contains a glass component and a ceramic component so that the volume ratio between the glass component and the ceramic component contents is 50:50 to 80:20.

8. The multilayered substrate as claimed in claim 6, wherein each of the substrates contains a glass component including $SiO_2$—RO—$Al_2O_3$—$B_2O_3$ (where R is alkaline earth metal).

9. The multilayered substrate as claimed in claim 6, wherein each of the substrates contains a ceramic component including one or more components selected from the group consisting of $Al_2O_3$, $TiO_2$, and $TiO_2$ compound.

10. The multilayered substrate as claimed in claim 6, wherein the conductive patterns are capacitor electrodes.

11. A method for fabricating a multilayered substrate comprising:
preparing a conductive composition including metal powder containing Ag at not less than 95 mass %, a sintering restrainer containing Cr and/or Cr compound, and Al and/or Al compound, a dielectric loss conditioner containing Mn and/or Mn compound, and a vehicle;
forming electrodes made of the conductive composition on a plurality of green sheets formed of a glass-ceramic;
laminating the plurality of green sheets on which the electrodes are formed to form a laminated product; and,
sintering the laminated product.

12. The method for fabricating a multilayered substrate as claimed in claim 11, wherein Cr and/or Cr compound content calculated based on $Cr_2O_3$ is 0.1–2.0 mass % relative to metal powder.

13. The method for fabricating a multilayered substrate as claimed in claim 11, wherein Mn and/or Mn compound content calculated based on $MnO_2$ is 0.1–5.0 mass % relative to metal powder.

14. The method for fabricating a multilayered substrate as claimed in claim 11, wherein the Al and/or Al compound content calculated based on $Al_2O_3$ is 0.1–1.0 mass % relative to metal powder.

15. The method for fabricating a multilayered substrate as claimed in claim 11, wherein the metal powder has an average grain size of $0.1\mu m$–$10\mu m$.

16. The method for fabricating a multilayered substrate as claimed in claim 11, wherein the sintering step is performed at a temperature of 750° C.–940° C.

* * * * *

UNITED STATES PATENT AND TRADEMARK OFFICE
CERTIFICATE OF CORRECTION

PATENT NO.   : 6,738,251 B1
DATED        : May 18, 2004
INVENTOR(S)  : Hiroshi Tsuyuki and Osamu Hirose It is certified that error appears in the above-identified patent and that said Letters Patent is hereby corrected as shown below:

Title page,
Item [30], Foreign Application Priority Data, change "2000-0200003" to -- 2000-020003 --.

Column 7,
Line 12, insert the word -- an -- before the word "oxide."

Column 8,
Line 14, change the word "glass" to -- conductive --.
Line 22, change "1 Vrms" to -- 1Vrms -- and change "1 MHz" to -- 1MHz --.

Column 9,
Line 49, before the word, "Mn" delete the word, "and."

Column 10,
Line 1, after the word, "claimed" insert the word, -- in --.
Line 28, after the word, "and" delete the comma.

Signed and Sealed this

Thirteenth Day of July, 2004

JON W. DUDAS
*Acting Director of the United States Patent and Trademark Office*